United States Patent
Om'Mani et al.

(10) Patent No.: US 6,717,859 B1
(45) Date of Patent: Apr. 6, 2004

(54) AUTOMATIC PROGRAM- AND ERASE-VOLTAGE GENERATION FOR EEPROM CELLS

(75) Inventors: Henry A. Om'Mani, Albuquerque, NM (US); Thomas J. Davies, Jr., Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/184,709

(22) Filed: Jun. 26, 2002

(51) Int. Cl.⁷ ............................................. G11C 16/06
(52) U.S. Cl. ........................... 365/185.23; 365/185.21; 365/185.22
(58) Field of Search ................. 365/185.21, 185.22, 365/185.23, 185.29, 185.18, 185.24, 185.33, 189.09

(56) References Cited

U.S. PATENT DOCUMENTS

| | | | |
|---|---|---|---|
| 5,023,839 A | * 6/1991 | Suzuki et al. | 365/185.21 |
| 5,563,827 A | 10/1996 | Lee et al. | |
| 5,661,685 A | 8/1997 | Lee et al. | |
| 5,905,691 A | * 5/1999 | Tanzawa et al. | 365/233 |
| 6,469,924 B2 | * 10/2002 | Jain | 365/154 |
| 6,469,925 B1 | * 10/2002 | Jain | 365/154 |

* cited by examiner

*Primary Examiner*—Gene Auduong
(74) *Attorney, Agent, or Firm*—Arthur J. Behiel; Edel M. Young

(57) ABSTRACT

Described are circuits and methods for automatically measuring the program threshold voltage $V_{TP}$ and the erase threshold voltage $V_{TE}$ of EEPROM cells. The measured threshold voltages are employed to measure tunnel-oxide thickness and to determine optimal program and erase voltage levels for EEPROM circuits. One embodiment automatically sets the program and erase voltages based on the measured threshold voltages.

21 Claims, 3 Drawing Sheets

AUTOMATIC PROGRAM- AND ERASE-VOLTAGE GENERATION FOR EEPROM CELLS

FIELD OF THE INVENTION

This invention relates generally to electronically erasable memory circuits, and in particular to methods and apparatus for analyzing physical and electrical properties of such circuits.

BACKGROUND

FIG. 1 depicts a conventional memory circuits 100, including a sense amplifier 105 and an EEPROM cell 110. Cell 110 includes an access transistor 112, a storage transistor 114, and a program transistor 116. The source of program transistor 116 connects to the gate of storage transistor 114 via an insulating layer, typically referred to as a "tunnel oxide" layer 118. Tunnel oxide layer 118 has a thickness $T_{OX}$ that is thin enough to permit electrons to tunnel to and from the gate of transistor 114 when the proper bias voltages are applied to various terminals of EEPROM cell 110. Cell 110 also includes a capacitor 120 connected between the floating gate of transistor 114 and a control gate CG.

TABLE 1

| Node | Program | Erase | Read/Verify |
|---|---|---|---|
| AG | $V_{PP}$ | $V_{EE}$ | $V_{DD}$ |
| VGND | Z | 0 | 0 |
| CG | 0 | $V_{EE}$ | $V_{DD}$ |
| PCB | 0 | 0 | $V_{DD}$ |
| PBL | $V_{PP}-V_t$ | 0 | $V_t$ |
| RBL | Z | 0 | Data |

As shown in Table 1 above, storage transistor 114 is programmed by simultaneously:
1. presenting high impedances (Z) on the source and drain of transistor 114 by turning transistor 112 on and disconnecting node RBL and VGND from external circuitry;
2. connecting the control terminal (gate) of transistor 114 through transistor 116 and tunnel oxide layer 118 to a programming voltage $V_{PP}-V_t$ (the $V_t$ drop is due to a transistor, not shown, connected between the program/erase node $V_{PE}$); and
3. holding control-gate node CG at zero volts.

The programming voltage $V_{PP}$ is high relative to the operating voltage $V_{DD}$ Of EEPROM cell 110. For example, the programming voltage $V_{PP}$ might be about 14 volts for an EEPROM cell for which $V_{DD}$ is about 1.8 volts. With storage transistor 114 biased as listed above, electrons travel through the tunnel oxide 118 away from the gate of transistor 114, leaving the gate with a relatively positive net charge. This charge shifts the threshold voltage $V_T$ (i.e., the voltage at which transistor 114 conducts the minimum current necessary to trip sense amplifier 110) in the negative direction. The new "programmed" threshold voltage $V_{TP}$ is then less than $V_{DD}$.

Referring again to Table 1, storage transistor 114 is erased by simultaneously:
1. applying a relatively high erase voltage $V_{EE}$ to the gate of storage transistor 114 via control-gate node CG;
2. applying a relatively low voltage to the program bit line PBL (the source of the low voltage is omitted); and
3. turning program transistor 116 on.

Thus biased, positive charge collected on the gate of storage transistor 114 is swept away through tunnel oxide 118, shifting the threshold voltage of storage transistor 114 to an erase threshold voltage $V_{TE}$ above $V_{DD}$.

The following Equation 1 summarizes the relationship between the program threshold voltage $V_{TP}$, erase threshold voltage $V_{TE}$, and supply voltage $V_{DD}$:

$$V_{TP} < V_{DD} < V_{TE} \qquad \text{eq. (1)}$$

Once programmed, cell 110 can be read by applying $V_{DD}$ to the access gate AG of transistor 112, control gate CG, and pre-charge node /PC (the "/" designate an active low signal). Pre-charge node /PC is held low between reads to hold the input of a series of inverters 122 and 123 high, and consequently to hold the output node SA of sense amp 110 at a logic one. Pre-charge node /PC goes high during a read, connecting the input of inverter 122 to the read bit line RBL via a transistor 128. If the threshold voltage of transistor 114 is above $V_{DD}$, then the read bit line RBL will not conduct, and sense amp 105 will continue to output a high (logic one) output signal on sense amplifier output node SA. If, on the other hand, the threshold voltage of transistor 114 is below $V_{DD}$, then transistors 112 and 114 will conduct with $V_{DD}$ applied to terminals AG and CG, and the resulting current through read bit line RBL will overcome the pre-charge in sense amp 105, forcing the output node SA of sense amp 105 to transition to a logic zero.

Due to the relatively high program and erase voltages, some transistors in circuit 100 are high-voltage transistors, as conventionally indicated using an additional line segment in parallel with the gates of those transistors.

In addition to programming and erasing storage cell 114, the supporting circuitry should also be able to verify program and erase states. As noted above, the programmed threshold voltage $V_{TP}$ of transistor 114 is $V_{DD}$ and the erase threshold voltage $V_{TE}$ is above $V_{DD}$. Moreover, the program and erase threshold voltages are sufficiently different from $V_{DD}$ to provide a guard band that allows for operating changes due to power-supply and temperature fluctuations.

The need for guard bands might lead one to conclude that the voltage range between the program threshold voltage $V_{TP}$ and the erase threshold voltage $V_{TE}$ (i.e., the "cell margin") should be as large as possible. However, the relatively high program and erase voltages required to maximize the cell margin tend to limit cell life. Moreover, maximizing the cell margin means increasing program and erase times, and keeping these times short is of considerable interest to customers. Manufacturers of EEPROM cells are therefore interested in identifying a program/erase margin that provides a desired balance between program and erase speeds, device lifetime, and insensitivity to errors.

A problem that arises when selecting an appropriate cell margin for a given collection of memory cells is that process variations can have a substantial impact on program and erase threshold voltages. One parameter that is particularly important is the oxide thickness $T_{OX}$ of tunnel oxide 118. Experiments have shown that even relatively small changes in oxide thickness can have significant impacts on program and erase threshold voltages. It is therefore important to determine—often for each wafer—the program and erase voltages required to produce a desired margin. Unfortunately, assessing an individual wafer to optimize program and erase voltages can be difficult and time consuming. There is therefore a need for a more effective means of optimizing applied program and erase voltage levels to provide desired cell margins.

SUMMARY

Described are circuits and methods for automatically measuring the program threshold voltage $V_{TP}$ and the erase threshold voltage $V_{TE}$ of EEPROM cells. The measured threshold voltages are employed to measure tunnel-oxide thickness and to determine optimal program and erase voltage levels for EEPROM circuits. One embodiment automatically sets the program and erase voltages based on the measured threshold voltages, and thus eliminates the labor intensive task of iteratively determining and setting optimal program and erase voltages.

This summary does not limit the invention, which is instead defined by the claims.

DETAILED DESCRIPTION

Figure 2:
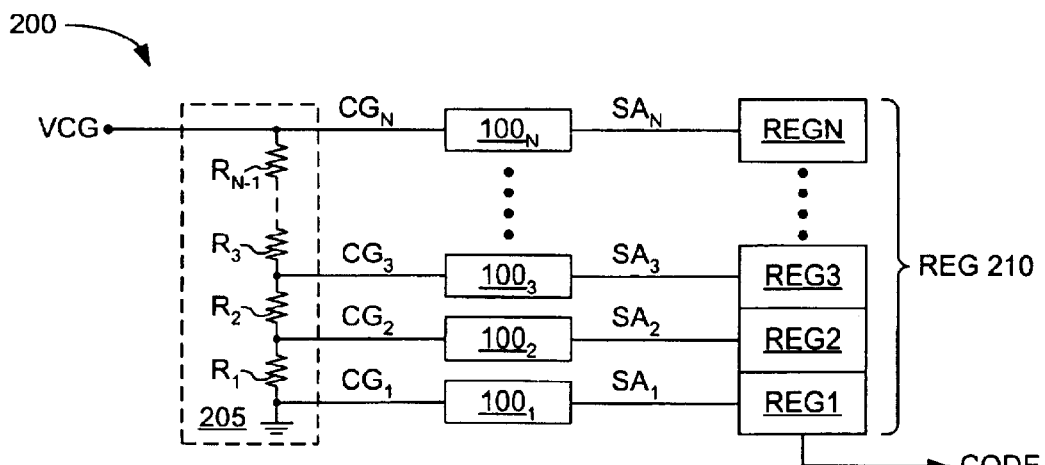
FIG. 2 depicts a test circuit 200 in accordance with an embodiment of the invention.

FIG. 2 depicts a test circuit 200 in accordance with an embodiment of the invention. Test circuit 200 can be included on otherwise conventional EEPROM wafers or EEPROM die to automatically measure the program threshold voltage $V_{TP}$ and the erase threshold voltage $V_{TE}$ of EEPROM cells for given program and erase voltages $V_{PP}$ and $V_{EE}$. In one embodiment, the measured threshold voltages are related to the program and erase voltages to measure oxide thickness $T_{OX}$. In another embodiment, the measured threshold voltages are compared with desired threshold voltages to find program and erase voltage levels appropriate to achieve the desired threshold voltages. In an example described below in connection with FIG. 6, the measured threshold voltages provided by test circuit 200 automatically set the program and erase voltages for a given EEPROM, and consequently eliminate the labor intensive task of iteratively determining and setting program and erase voltages.

Figure 1:
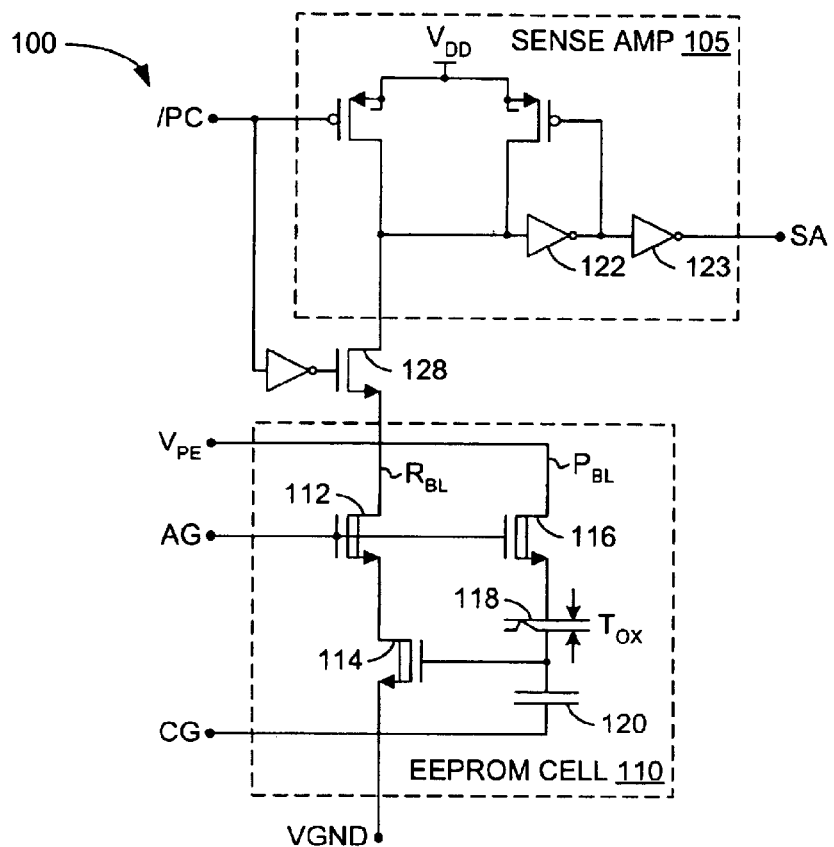
FIG. 1 (prior art) depicts a conventional memory structure 100, including a sense amplifier 105 and an EEPROM cell 110.

Test circuit 200 includes a voltage divider 205, N versions $100_1$–$100_N$ of memory circuit 100 of FIG. 1, and an N-bit register 210. Voltage divider 205 includes N−1 like-valued resistors $R_1$–$RN_{N-1}$ connected in series between an input terminal VCG (for "control-gate voltage") and ground potential. The control gate CG of each memory circuit 100 connects to a respective output node of a voltage divider 205, so that each memory circuit $100_1$–$100_N$ receives a slightly different control-gate voltage. Each memory element of register 210 connects to respective sense-amplifier output terminal SA. The number N is 21 in the illustrative example discussed herein.

To use test circuit 200, the EEPROM device under test is first bulk erased using a known erase voltage $V_{EE}$ provided from a voltage source either on or off chip. Next, a test control gate voltage VCG of e.g. four volts is applied to the like-named input terminal of voltage divider 205. Because resistors $R_1$–$R_{N-1}$ are equivalent, voltage divider 205 simultaneously provides twenty-one output unique voltages $CG_1$ through $CG_N$ ranging from zero volts to four volts in 0.2-volt increments. The voltage on each of the respective control gates $CG_{1-N}$ of memory circuits $100_{1-N}$ therefore differs from the voltage on adjacent control gates by plus or minus 0.2 volts.

Assuming the erase threshold voltage $V_{TE}$ for the memory cells within memory circuits $100_{0-N}$ is between zero and four volts, at least one of memory circuits $100_{1-N}$ will produce a logic-one output signal on the respective sense amp output node SA. For example, if the EEPROM cells within memory circuits $100_{1-N}$ are erased and exhibit an erase threshold voltage $V_{TE}$ of three volts, then each of memory circuits $100_{1-N}$ that receives three volts or greater on its respective control gate will produce a logic zero, while the remaining memory circuits will produce logic ones. In an example in which $V_{TE}$ is three volts, memory circuits $100_1$ through $100_{15}$ will receive less than three volts on their control gates, and will consequently output logic ones, whereas memory circuits $100_{16}$ through $100_{21}$ will receive three volts or greater and will consequently output logic zeros. Register 210 will therefore store a stream of bits in which the six most significant bits are logic zeroes and the fifteen least significant bits are logic ones (i.e., 000 000 111 111 111 111 111). The least-significant zero bit is bit 16 (i.e., LSB0=16).

In general, the threshold voltage $V_{TE}$ for an erased cell can be expressed as:

$$V_{TE} = \frac{VCG}{(N-1)}(LSB0 - 1) \qquad \text{eq. (2)}$$

The code stored within register 210 is therefore a measure of the erase threshold voltage $V_{TE}$ of the EEPROM cells within memory circuits 100. Because these EEPROM cells are identical to those in the remainder of the EEPROM device, the stored code within register 210 is also a measure of the erase threshold voltage $V_{TE}$ of all the EEPROM cells on the EEPROM device under test.

The program threshold voltage $V_{TP}$ of the EEPROM cells can be measured in the same manner as the erase threshold voltage. To begin with, the EEPROM cells in test circuit 200 are bulk programmed using a known program voltage $V_{PP}$ provided from a voltage source either on or off chip. Each EEPROM cell within test circuit 200 can then be read again. The relationship of Equation 2 still holds true; this time, however the code stored within register 210 is a measure of the program threshold voltage $V_{TP}$.

Memory cells 110 in the example express a programmed state using a relatively low threshold voltage, so the voltage provided to node VCG can be reduced when measuring the program threshold voltage $V_{TP}$. In general, the range of voltage divided across voltage divider 205 can be altered, as can the number of resistors, to provide different ranges and measurement granularity, as desired.

The program threshold voltage $V_{TP}$ depends upon the programming voltage $V_{PP}$ and the oxide thickness $T_{OX}$ of oxide layer 118 (FIG. 1). For one process, for example, it was empirically discovered that cells with 90-angstrom oxide layers programmed using a 14.5-volt programming voltage $V_{PP}$ exhibited a program threshold voltage $V_{TP}$ of between 1.65 and 1.80 volts. In contrast, cells fabricated using the same process but with an oxide thickness of 80 angstroms exhibited a program threshold voltage $V_{TP}$ of about zero volts when programmed at 14.5 volts. Erase threshold voltages are similarly affected by oxide thickness.

Figure 3:
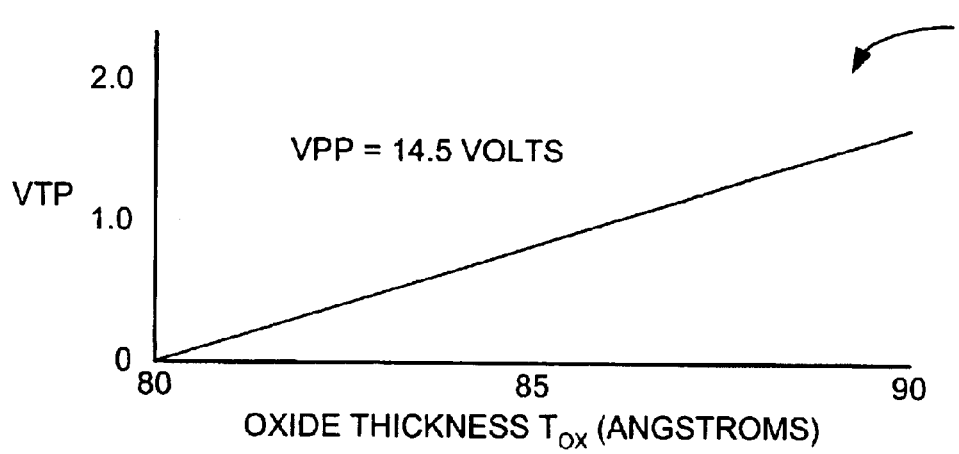
FIG. 3 is a graph 300 depicting an illustrative relationship between program threshold voltage $V_{TP}$ and oxide thickness $T_{OX}$ for a fixed program voltage $V_{PP}$.

FIG. 3 is a graph 300 depicting an illustrative relationship between program threshold voltage $V_{TP}$ and oxide thickness $T_{OX}$ for a fixed program voltage $V_{PP}$ of 14.5 volts. Graph 300 is for illustration only; in practice, the relationship in graph 300 is discovered empirically using conventional test equipment available to those of skill in the art. Once the relationship between oxide thickness $T_{OX}$, programming voltage $V_{PP}$, and program threshold voltage $V_{TP}$ is well characterized, the code from register 210 indicative of the program threshold voltage $V_{TP}$ for a known programming voltage $V_{PP}$ can be applied to the relationship expressed in graph 300 to determine the tunnel oxide thickness for a given sample. A similar relationship between erase voltages and erase threshold voltages can be derived and used to measure oxide thickness.

Figure 4:
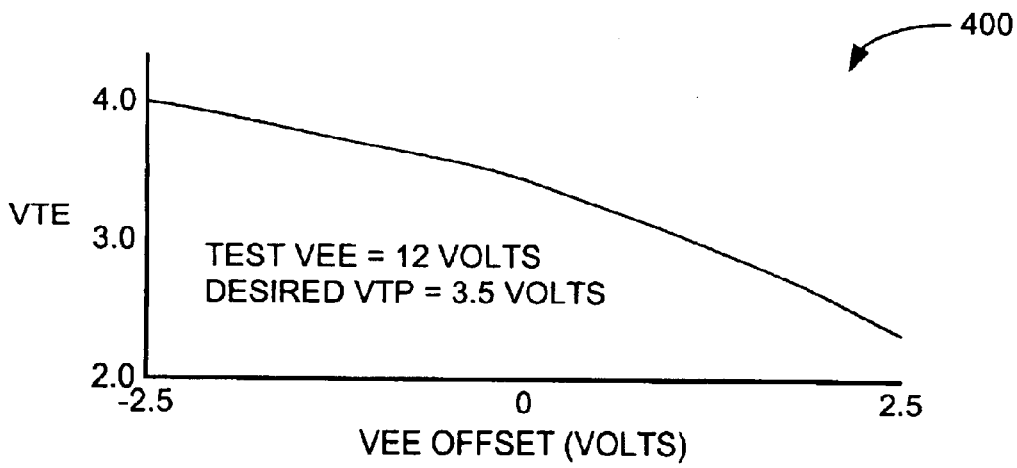
FIG. 4 is a graph 400 depicting an illustrative relationship between erase threshold voltage $V_{TE}$ and the appropriate erase-voltage offset required to move the erase threshold voltage $V_{TE}$ to a desired level.

FIG. 4 is a graph 400 depicting an illustrative relationship between. erase threshold voltage $V_{TE}$ and the appropriate erase-voltage offset required to move the erase threshold voltage $V_{TE}$ to a desired level. Graph 400 is for illustration only; in practice, the relationship in graph 400 is discovered empirically. In the example, the relationship is derived using a nominal erase voltage $V_{EE}$ of 12 volts.

To use the information of graph 400, the test circuit 205 (FIG. 2) is bulk erased, using an erase voltage $V_{EE}$ of 12 volts, and then employed to measure the erase threshold voltage $V_{TE}$. The measured erase threshold voltage is then applied to the relationship of graph 400 to determine the $V_{EE}$ offset required to increase or decrease the erase threshold voltage $V_{TE}$ to the desired level (e.g., 3.5 volts in this example). The offset voltage is then added to the nominal erase voltage to find the erase voltage $V_{EE}$ that will result in the desired erase threshold voltage $V_{TE}$.

Figure 5:
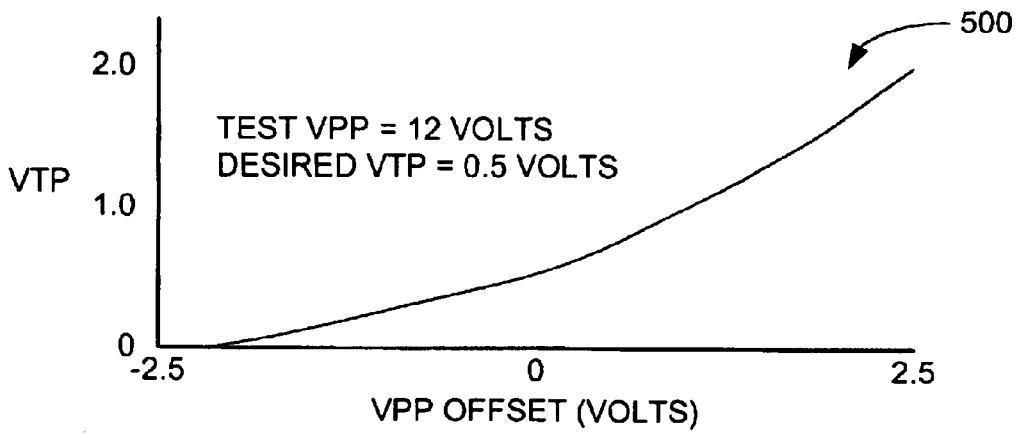
FIG. 5 is a graph 500 depicting an illustrative relationship between program threshold voltage VTP and the appropriate program-voltage offset required to move the program threshold voltage VTP to a desired level.

FIG. 5 is a graph 500 depicting an illustrative relationship between program threshold voltage $V_{TP}$ and the appropriate program-voltage offset required to move the program threshold voltage $V_{TP}$ to a desired level. Graph 500 is for illustration only; in practice, the relationship in graph 400 is discovered empirically. In the example, the relationship is derived using a nominal program voltage $V_{PP}$ of 12 volts.

To use the information of graph 500, the test circuit 205 is bulk programmed using the nominal program voltage and then employed to measure the program threshold voltage $V_{TP}$. The measured program threshold voltage is then applied to the relationship of graph 500 to determine the $V_{PP}$ offset required to increase or decrease the program threshold voltage $V_{TP}$ to the desired level (e.g., 0.5 volts in this example). The program-offset voltage is then added to the nominal program voltage to find the program voltage $V_{PP}$ that will produce the desired program threshold voltage $V_{TP}$.

Figure 6:
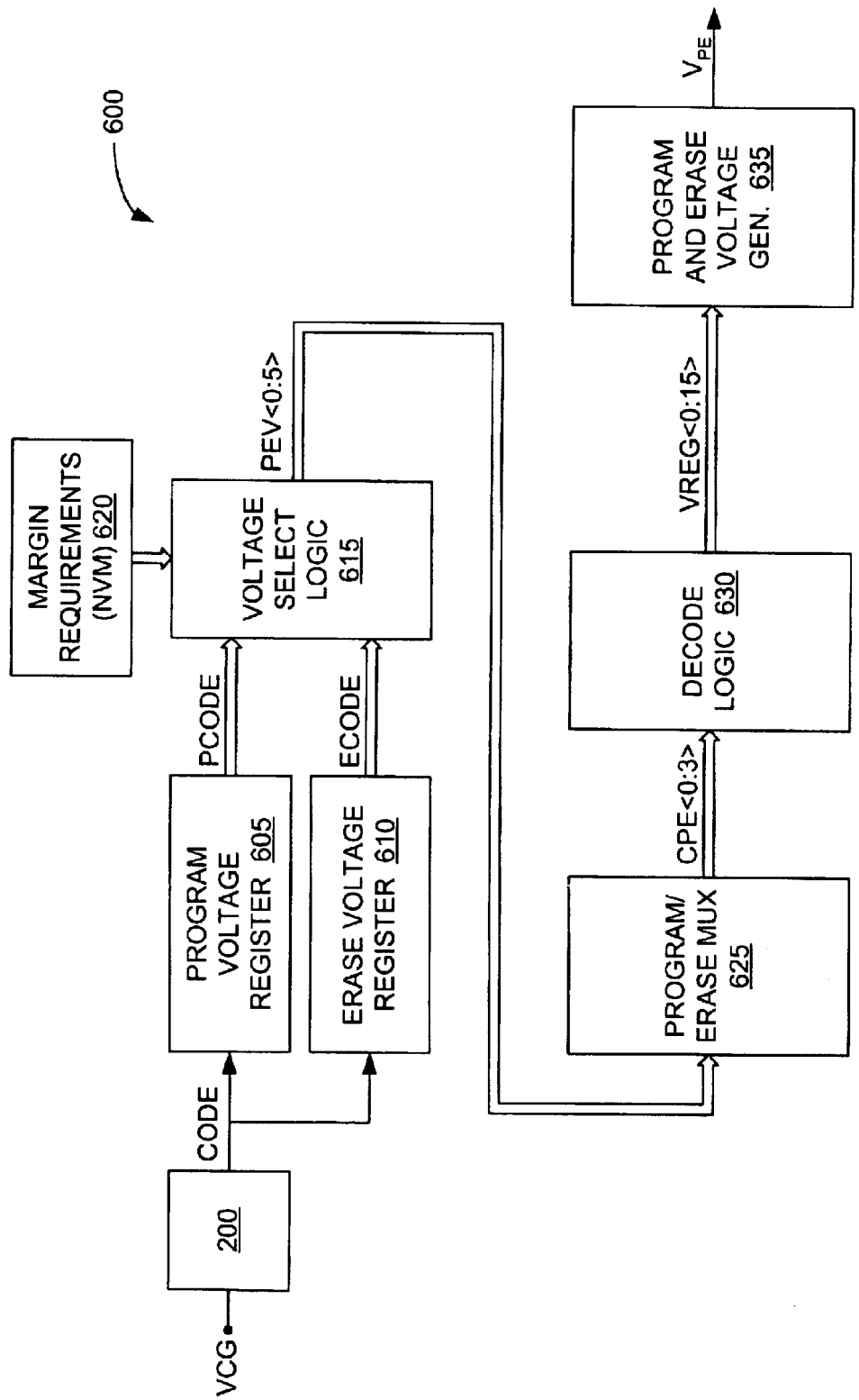
FIG. 6 depicts a circuit 600 adapted to automatically provide appropriate program and erase voltages $V_{PP}$ and $V_{EE}$ to establish a desired margin.

FIG. 6 depicts a circuit 600 adapted to automatically provide appropriate program and erase voltages $V_{PP}$ and $V_{EE}$ to establish a desired margin (i.e., to establish program and erase threshold voltages $V_{TP}$ and $V_{TE}$). Circuit 600 includes test circuit 200 of FIG. 2, which provides its output codes to a pair of registers; a program voltage register 605 and an erase voltage register 610. The code from register 210 relating to the program threshold voltage $V_{TP}$ is stored within program voltage register 605, whereas the code associated with the erase voltage threshold $V_{TE}$ is stored within erase voltage register 610. The codes stored in registers 605 and 610 are provided to some voltage select logic 615 via a pair of busses PCODE and ECODE.

Voltage select logic 615 also receives a pair of expressions of margin requirements from some non-volatile memory 620. The margin requirements desired for a particular process are determined in advance. Digital expressions of the desired program and erase threshold voltages are then programmed into non-volatile memory in each EEPROM device prepared using the process. In one embodiment, the margin requirements are specified in non-volatile memory 620 using "thermometer" codes like those used to specify the measured program and erase threshold voltages $V_{TP}$ and $V_{TE}$ in program voltage register 605 and erase voltage register 610. Voltage select logic 615 is a digital comparator that compares the desired margin requirements with the actual margin requirements in registers 605 and 610 to develop a six-bit signal indicative of the desired program and erase voltages. The six-bit signal is then provided on a bus PEV <0:5> to a program/erase multiplexer 625. In effect, voltage select logic is programmed to automatically provide program and erase offset voltages using relationships of the type discussed above in connection with FIGS. 4 and 5.

Based on the signals received on bus PEV<0:5>, program/erase multiplexer 625 determines the voltage level on program and erase voltage terminal $V_{PE}$ during program and erase cycles. Program/erase multiplexer 625 is described in detail in U.S. Pat. No. 5,661,685 to Lee et al., which issued on Aug. 26, 1997, and is incorporated herein by reference. Program/erase multiplexer 625 produces a four-bit code CPE<0:3> to some decode logic 630, which decodes the four-bit signal into a sixteen-bit signal VREG to a program and erase voltage generator 635. Decode logic 630 and program and erase voltage generator 635 are both detailed in the above-referenced patent to Lee et al.

Conventional EEPROM (including so-called "Flash" memory) circuits include "trim bits," which are non-volatile memory cells that can be programmed to "trim" program and erase voltages generated on chip. In the Lee et al. patent, six trim bits connect to the input port of multiplexer 625 to establish desired program and erase voltages. In contrast, the trim signals to multiplexer 625 are automatically generated by the circuitry preceding multiplexer 625.

The EEPROM is bulk erased prior to the program and erase tests described above. Part of the bulk erase process resets memory cells within multiplexer 625 that determine the nominal value of program and erase voltages $V_{PP}$ and $V_{EE}$ (the program and erase voltages $V_{PP}$ and $V_{EE}$ are provided on terminal $V_{PE}$ from program and erase voltage generator 635). In one embodiment, for example, the nominal program and erase voltages are set to 12.5 volts. Once the program and erase voltages are established using the above-described process, the memory cells within multiplexer 625 control the program and erase voltages for the duration of the programming and/or erase cycles.

Margins can change over time. The present invention advantageously accounts for such changes, and consequently increases the lifetime of EEPROM cells, by re-establishing the appropriate program and erase voltages each time the cell is programmed or erased.

While the present invention has been described in connection with specific embodiments, variations of these embodiments will be obvious to those of ordinary skill in the art. For example, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

It is claimed:

1. A circuit comprising:
   a. a plurality of programmable memory cells, each memory cell including a read bit line and a control gate, wherein each memory cell conducts a minimum current via the associated read bit line when a voltage applied to the control gate meets a minimum threshold voltage; and
   b. a voltage source having a plurality of voltage-source output nodes, each voltage-source output node connected to a respective one of the plurality of control gates and adapted to provide a unique control voltage to the respective one of the plurality of control gates.

2. The circuit of claim 1, further comprising, for each memory cell:
   a. a sense amplifier having a sense-amplifier input node connected to the read bit line; and
   b. a sense-amplifier output node.

3. The circuit of claim 2, wherein the sense amplifier is pre-charged to provide a first logic level on the sense-amplifier output node, and wherein the minimum current is the least current level required on the sense-amplifier input node to transition the sense-amplifier output node to a second logic level.

4. The circuit of claim 2, further comprising a collection of storage elements each having a storage-element input node connected to one of the sense-amplifier output nodes.

5. The circuit of claim 4, wherein the collection of storage elements comprise a register.

6. The circuit of claim 1, wherein the voltage source comprises a voltage divider.

7. The circuit of claim 6, wherein the voltage divider includes, a plurality of resistors, each resistor extending between a pair of the voltage-source output nodes.

8. The circuit of claim 1, further comprising:
   a. a sense amplifier for each memory cell, each sense amplifier having:
      i. a sense-amplifier input node connected to the read bit line; and
      ii. a sense-amplifier output node;
      iii. wherein the sense-amplifier output node provides a first logic level representative of a first binary number if the unique control voltage to the corresponding memory cell meets the minimum threshold requirement, and provides a second logic level representative of a second binary number if the unique control voltage to the corresponding memory cell fails to meet the minimum threshold requirement; and
   b. wherein the logic levels on the plurality of sense-amplifier output nodes collectively provide a code relating to a threshold voltage of the memory cells.

9. The circuit of claim 8, further comprising a program register connected to the sense amplifier output nodes and adapted to store the code.

10. The circuit of claim 9, further comprising encoding logic connected to the program register and adapted to select a programming voltage based upon the code.

11. The circuit of claim 9, further comprising an erase register connected to the sense amplifier output nodes.

12. The circuit of claim 11, further comprising encoding logic connected to the program register and the erase register and adapted to select a program voltage based upon the code in the program register and to select an erase voltage based upon a second code stored in the erase register.

13. A method comprising:
   a. providing a collection of electronically erasable memory cells on an integrated circuit, each memory cell including a respective control gate and having a respective threshold voltage;
   b. programming the memory cells to reduce the threshold voltages of the memory cells;
   c. providing a plurality of unique control-gate voltages;
   d. applying each of the unigue control-gate voltages to the control gate of a respective one of the programmed memory cells; and
   e. determining which of the programmed memory cells conducts in response to with the respective applied unique control-gate voltage.

14. The method of claim 13, further comprising storing, on the integrated circuit, data indicative of a margin requirement for the collection of electronically erasable memory cells.

15. The method of claim 14, further comprising setting a program voltage for the collection of electronically erasable-memory cells based on the data and the minimum one of the plurality of unique control-gate voltages for which the corresponding one of the electronically erasable memory cells conducts.

16. The method of claim 13, wherein the unique control-gate voltages are provided to the control gates substantially simultaneously.

17. The method of claim 16, further comprising generating the unique control-gate voltages using a voltage divider.

18. A method comprising:
   a. providing a collection of electronically erasable memory cells on an integrated circuit, each memory cell including a respective control gate;
   b. providing a Plurality of unique control-gate voltages to respective ones of the plurality of control gates;
   c. determining which of the collection of memory cells conducts with the applied unigue control-gate voltage; and
   d. determining which of the collection of memory cells conducts with a lowest one of the applied unique control-gate voltages.

19. The method of claim 18, further comprising defining a relationship between programming-voltage levels and minimum control-gate voltages and applying the relationship to the lowest one of the applied unique control-gate voltages to obtain a programming voltage.

20. The method of claim 18, wherein each memory cell includes an insulating layer having an insulating-layer thickness,:the method further comprising defining a relationship between the insulating-layer thickness and minimum control-gate voltages and applying the relationship to the lowest one of the applied unique control-gate voltages to obtain a measure of the insulating-layer thickness.

21. The method of claim 20, wherein the insulating layer comprises an oxide.

* * * * *